United States Patent [19]

Sidders

[11] 4,183,975
[45] Jan. 15, 1980

[54] VACUUM METALLIZING PROCESS

[75] Inventor: Jerry F. Sidders, Urbana, Ohio

[73] Assignee: Dare Pafco, Inc., Urbana, Ohio

[21] Appl. No.: 887,260

[22] Filed: Mar. 16, 1978

[51] Int. Cl.² .............................................. B05D 3/06
[52] U.S. Cl. .................................... 427/50; 427/250; 427/404; 427/407 C
[58] Field of Search ...................... 427/38, 39, 42, 50, 427/161, 162, 164, 250, 251, 296, 404, 407 C; 350/163, 165

[56] References Cited

U.S. PATENT DOCUMENTS

| | | | |
|---|---|---|---|
| 2,422,609 | 6/1947 | Auwarter | 427/166 |
| 2,793,143 | 5/1957 | Kohring | 427/50 |
| 2,891,880 | 6/1959 | Nakken | 427/102 |
| 2,904,452 | 9/1959 | Reichelt | 427/50 |
| 2,962,393 | 11/1960 | Ruckelshaus | 427/102 |
| 3,992,477 | 11/1976 | Dickie et al. | 427/250 |
| 4,016,305 | 4/1977 | Wakabayashi et al. | 427/250 |

FOREIGN PATENT DOCUMENTS 1013169 12/1965 United Kingdom ...................... 427/50

*Primary Examiner*—John H. Newsome
*Attorney, Agent, or Firm*—Wood, Herron & Evans

[57] ABSTRACT

This invention is directed to a vacuum metallizing process and, particularly, to an improved process for applying thin chromium coatings to the surface of both rigid and flexible plastic articles. The method includes securing a high purity chromium bar between spaced electrodes, mounting the articles to be coated in proximity to the bar, passing an electric current directly through the bar sufficient to evaporate chromium from the surface thereof, and condensing the evaporated metal on the surface of the plastic articles. The method is carried out at a subatmospheric pressure in the range of 2 to $5 \times 10^{-5}$ mm Hg. Articles made in accordance with the method disclosed possess an adherent bright, reflective chromium film of a thickness in the range of about 800 to 1000 Å.

9 Claims, 3 Drawing Figures

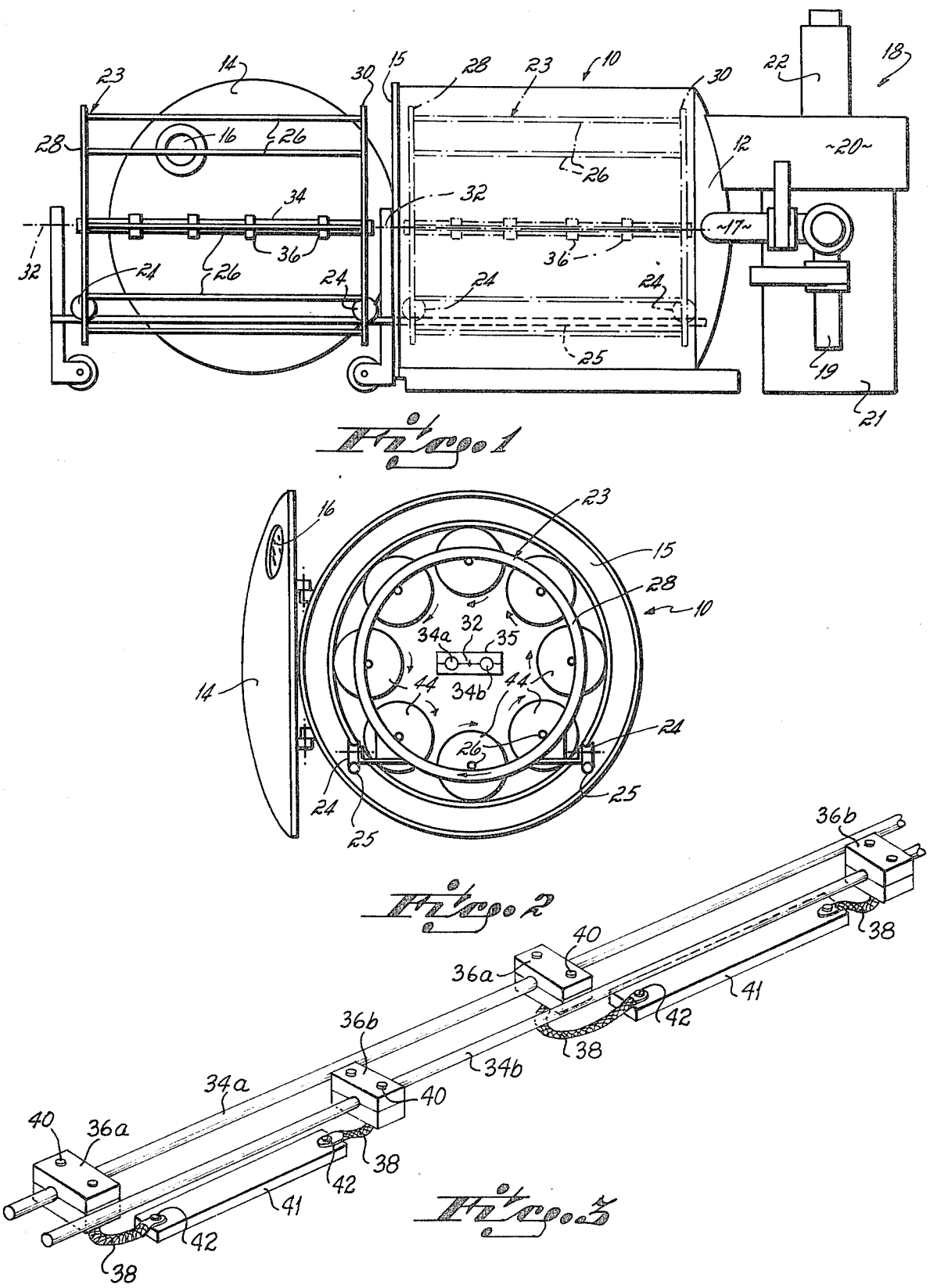

VACUUM METALLIZING PROCESS

BACKGROUND OF THE INVENTION

This invention relates to the application of chrome finishes to plastic articles and, more particularly, to an improved vacuum metallizing process for applying chromium coatings on rigid and flexible plastic articles.

Plastics offer a lower cost, lighter weight substitute to metals and alloys as a material of construction in a wide variety of articles of manufacture. In the automotive industry, for example, more emphasis than ever is being placed on the use of plastics in place of metals both to lower the cost of manufacture and to reduce vehicle weight to thereby increase the fuel efficiency of the vehicles. Examples of parts where this substitution can be made include head and rear lamp bezels, integral signal lamp housings and bezels, side marker lamp housings, radiator grills, bumper components, window trim, and wheel covers. However, when plastics are substituted for metals, it is often highly desired that the parts be provided with a bright, reflective surface simulating the metallic lustre of the parts they replaced. In automotive applications, it is specifically desired that certain plastic parts be provided with a bright, reflective metallic surface simulating the traditional appearance of chrome-plated steel.

Vacuum metallizing offers a relatively low cost means for obtaining metallic finishes on plastic parts. Vacuum metallizing refers generally to a process wherein the coating metal is evaporated by resistance heating and is then condensed on the surface of the article to be coated all at a subatmospheric pressure to prevent the oxidation of the coating metal during the evaporation and deposition steps. Conventional resistance-fired vacuum metallizing processes employ a large number of metal heating filaments, typically tungsten in a spiralled configuration, spaced along the length of a rack upon which the articles to be coated are mounted. The metal to be evaporated and deposited on the articles is in the form of small wire strips which are suspended on the individual tungsten heating elements. When an electric current is passed through the tungsten elements, the elements rise in temperature thereby melting the coating metal which then flows over the heating elements and adheres thereto. On increasing the current through the heating elements, the liquid metal is evaporated and subsequently condenses on the articles to be coated. The entire process is carried out in a vacuum in the range of about $10^{-3}$ to $5 \times 10^{-4}$ mm Hg. Aluminum and other metals and alloys have been vacuum metallized by such conventional resistance-fired processes in the manufacture of parts for interior applications in the automotive industry. Although such coatings have been successful in interior applications, they have proved unsuccessful in exterior applications where the corrosion and abrasion resistance of the coatings become important. For example, resistance-fired aluminum has proved unsuccessful in exterior applications because of its inherent tendency to corrode to a soft, dull aluminum oxide. For vacuum metallizing to be an acceptable method of coating plastic articles for exterior applications in the automotive industry, it must provide a metal finish possessing good color and brightness, corrosion and abrasion resistance sufficient to retain its bright finish for the life of the vehicle, good weatherability, and good resistance to road chemicals, gasoline, antifreeze and car wash detergents.

Prior art attempts to provide coatings meeting these criteria have employed more highly corrosion resistant metals and alloys such as stainless steel, nickel-chromium alloy, and chromium in conventional resistance-fired vacuum metallizing processes. Parts so coated have been found to be unacceptible for exterior automotive applications for a number of reasons. For example, chromium applied by conventional resistance-firing is much darker in color than electroplated chrome. It is often referred to as "black" chrome and does not have an appearance acceptable for exterior automotive applications. In substance, the means has not heretofore been reported for supplying rigid and flexible plastic parts with an adherent bright, reflective metal finish simulating the appealing traditional color and brightness of conventional electroplated chromium and possessing the requisite corrosion and abrasion resistance.

SUMMARY OF THE INVENTION

This invention consists of a unique method for applying chromium coatings to plastic parts especially those used in exterior applications where the corrosion and abrasion resistance of the coatings are important. The invention overcomes a number of problems heretofore associated with the prior art techniques discussed above. In accordance with the principles of this invention, both rigid and flexible plastic parts are provided with adherent bright, reflective chromium films which are decorative in appearance and simulate conventional electroplated chrome coatings.

In its general aspect, this invention provides a process for applying chrome finishes to plastic articles by a vacuum resistance firing technique wherein high purity chromium metal is evaporated by direct resistance heating without the provision of any resistance heating filaments or the like as are employed in conventional resistance firing techniques. In its preferred embodiment, the steps of this process include securing one or more high purity chromium bars between spaced electrodes in a vacuum chamber, mounting the plastic articles to be coated in spaced relation to the chromium bars, and evacuating the chamber to a subatmospheric pressure of at least about $5 \times 10^{-5}$ mm Hg. Electric current is then shunted directly through the metal bars to heat the metal. The applied current is then increased to evaporate chromium metal from the surface of the bars. The evaporated metal then condenses on the surface of the plastic articles to provide the articles with the desired coating of chromium metal.

In accordance with the principles of this invention, the purity of the chromium bars which are subsequently heated to evaporate chromium from the surface thereof is about 99.9%. Further, a relatively high vacuum of at least about $5 \times 10^{-5}$ mm Hg and, preferably, a vacuum in the range of $2 \times 10^{-5}$ mm Hg is employed. The preferred thickness of the chromium coating is in the range of 800 to 1000 Å. The time to achieve film thickness in this range depends upon the type of part coated but generally the process is carried out for about one to three minutes.

This invention is applicable to both rigid and flexible plastic substrates. For example, in automotive applications, rigid parts such as side marker lamp housings, rear lamp bezels and ornaments, signal lamp housings and bezels, and wheel covers are formed of rigid plastic such as ABS (acrylonitrile-butadiene-styrene) or Noryl (a phenylene oxide based resin sold by General Electric Co.). Flexible parts such as flexible radiator grills, head lamp bezels, and fender and bumper extensions are typically formed of thermoplastic urethanes or resins and to some extent EPDM rubber. In such applications, the applied metal film must be capable of flexing with the part without cracking or spalling of the metal film. It has been determined that the method of this invention provides such rigid and flexible substrates with adherent bright, reflective chrome coatings which are free of microcracks and dark coloring and have superior corrosion and abrasion resistance. The method of this invention thus provides plastic articles with corrosion and abrasion resistant chromium coatings which are decorative in appearance and simulate conventional electroplated chrome. In accordance with the principles of this invention, plastic articles are provided with a relatively thin chromium coating having a combination of highly useful and desired chemical and physical properties not heretofore commercially available in the prior art.

Another object of this invention is to provide plastic parts with chromium coatings which have good adhesion to the substrate upon which they are applied and further provide a good substrate for the application of adherent protective synthetic top coats. To this end, the plastic substrate is first provided with a thin synthetic base coat such as a catalyzed urethane or polyester to improve the adhesion of the chromium film to the plastic substrate, and the applied chromium film is then provided with a like protective synthetic top coat to improve the abrasion resistance of the chrome coating. The method of this invention thus further includes a combination of substrate, synthetic base and top coats and a vacuum metallized chromium coating to provide a superior combination of highly useful and desired properties not heretofore present in commercially available parts.

Among the many other advantages of the discovered method, in contrast to other techniques of the prior art are: the lower operating costs and lower capital investment in equipment as compared to other techniques such as electron beam and cathode sputtering, reduced energy consumption, reduced scrap loss and ability to recycle scrap, use of paint grade ABS instead of plated grade, reduced environmental pollution over electroplating processes, the method of this invention causing essentially no air or water pollution, and the applicability to the method to flexible and to three dimensional plastic substrates. Electroplated chrome will not flex, and three dimensional substrates cannot be hot stamped. Sputtered chrome has a tendency to microcrack when flexed.

These and other advantages of the invention will be further appreciated by reference to the following detailed description and drawings.

BRIEF DESCRIPTION OF THE DRAWINGS

FIG. 1 is a schematic side elevation view illustrating the apparatus for practicing the method of this invention;

FIG. 2 is a front elevation view of the apparatus shown in FIG. 1; and

FIG. 3 is a schematic illustration showing the mounting of the chromium bars in the practice of the method of this invention.

DETAILED DESCRIPTION OF THE INVENTION

The method of this invention as recited above is carried out in commercially available resistance firing vacuum equipment. This equipment is described below for purposes of illustrating suitable vacuum equipment for carrying out the method of this invention, those skilled in the art recognizing that the method is not limited to the specific piece of equipment described. Referring to FIG. 1, such apparatus includes a cylindrical vacuum chamber 10 of approximately six feet in inside diameter having a closed end 12 and a door 14 at the opposite end for gaining access to the chamber. The annular open end 15 of the chamber 10 is provided with an O-ring gasket (not shown) whereby on closing of the door a seal is achieved to permit evacuation of the chamber 10. The door 14 includes a sight glass 16 for viewing the inside of the chamber when the door is closed.

In communication with the chamber 10 through a conduit 17 is a vacuum apparatus 18 including a $17\frac{1}{2}$ hp power mechanical pump for withdrawing air from the vacuum chamber. This pump has the capability of providing a vacuum in the range of 300 microns. At this pressure, a high vacuum diffusion pump 19 in communication with the chamber 10 through a conduit 20 communicating with a vacuum chamber 21 is activated to further reduce the pressure in the chamber 10. The apparatus includes a high vacuum valve 22 and cooling coils therebelow in the chamber 21 having liquid nitrogen circulating through them which permit the unit to achieve the high vacuum of 2 to $5 \times 10^{-5}$ mm Hg required in the practice of this invention. The evacuation procedure is carried out in two stages. That is, a rough vacuum in the range of 100 to 140 microns is first drawn. Thereafter, a further vacuum is drawn by the diffusion pump with activation of the liquid nitrogen cooled trap until the pressure inside the vacuum chamber is in the range of 2 to $5 \times 10^{-5}$ mm Hg.

The apparatus is provided with a rack 23 which rolls into and out of the chamber by means of rollers 24 engaging tubular tracks 25 mounted to the interior of the chamber 10 (FIG. 2). The rack 23 is approximately six feet in length and includes a number of parallel rods 26 extending along the length of the rack between annular end members 28, 30 on the periphery of a circle having a radius of about two feet from the longitudinal axis 32 of the rack. The rods 26 include clamp means (not shown) for mounting the articles to be coated on the rods spaced along the length of the rack and generally a uniform distance from the axis 32 thereof.

A pair of electrically conductive copper bus bars 34a and 34b are mounted close to and generally parallel to the axis 32 of the rack 23. The bars are supported at their ends by non-metallic mounting blocks 35 which are in turn attached to the rack 23 by fixed supports (not shown). Spaced electrodes 36a and 36b having braided copper leads 38 are mounted on the bus bars 34a and 34b, respectively, by means of bolts 40. Across the spaced electrodes 36a and 36b are mounted bars 41 of the chromium metal to be evaporated in the coating process. Referring to FIG. 3, this mounting comprises passing bolts 42 through holes in each end of the bars and securing the bars 41 to the braided copper leads 38 which are in turn bolted to the electrodes 36a and 36b. By this arrangement, electric current passing through the bus bars 34a and 34b is shunted directly through the bars 41 of the coating material to heat the bars 41 to evaporate metal from the surface thereof. One or more chromium bars may be employed in the process. Typically, when a number of articles are to be coated, the articles are spaced along the length of the rack and likewise a number of bars are spaced along the length of the rack to insure uniform coating density of the various articles.

To further insure uniform coating and particularly coating on all exterior surfaces of the three dimensional articles, the rack is provided with a planetary type reel which rotates the annular ends 28, 30 and thereby all the rods 26 about the central axis 32 during the coating process and, simultaneously, rotates each rod 26 about its individual longitudinal axis. In this manner, each individual article travels a circular path about the longitudinal axis of the rod on which it is mounted (represented in FIG. 2 by the small circles 44) while all the articles rotate about axis 32. The direction of rotation is represented by the arrows in FIG. 2. In this manner, all surfaces of the articles are exposed to the interior of the rack and to the chromium bars mounted along the longitudinal axis thereof.

The drive as well as the electrical connection to the bus bars 34a and 34b is made through the closed end 12 of the vacuum chamber 10 by a suitable drive shaft extending through the end 12 with a seal thereabout and a conductive spring loaded plug connected to a source of electrical power. These connections are made when the rack is inserted into the chamber.

The apparatus includes a 55 KVA saturable core reactor capable of delivering 55 KVA to the electrodes. Both the vacuum and firing are controlled by instruments mounted on a control panel (not shown) next to the vacuum apparatus for automated production.

In operation, the parts to be coated are mounted on the rack along its length, and the chromium bars are bolted to the leads 38. The rack is then rolled into the vacuum chamber 10, and the door 14 is closed and sealed. The interior of the chamber is visible through the sight glass 16 in the door 10. The vacuum control is then activated, activating the roughing pump until a vacuum of approximately 100 to 150 microns is obtained. The time required to pump a dry empty chamber of the size described to 150 microns is approximately four minutes. When the chamber pressure reaches 150 microns or less, the diffusion pump is activated to pump the chamber down to the desired pressure of $5 \times 10^{-5}$ mm Hg or less. The pump down continues until a pressure of about $4 \times 10^{-4}$ mm Hg or less is reached. At this point, the liquid nitrogen system is activated enabling the liquid nitrogen coil to assist the pumping capacity of the diffusion pump to reach the ultimate pressure employed during the firing process of $5 \times 10^{-5}$ mm Hg or less. Power is then applied to the electrodes to heat the chromium bars. Initially, approximately 20 to 30% of the available power is applied for about 30 to 120 seconds to slowly heat up the bars to prevent their breaking by thermal shock. The power is then increased to 70 to 75% of maximum and held for the duration of the firing process. This is approximately one to three minutes. At this power setting, approximately 3000 to 3500 amps and 14 to 16 volts power are achieved. Observation through the sight glass indicates that the chrome bars are glowing with a bright, red color and evaporating chromium from the surface thereof. On completion of the firing, the filament power control is turned to zero and the bars are allowed to cool. A vacuum break valve is then opened to return the chamber to atmospheric pressure to permit the door to be opened for removal of the rack of plated parts. Another rack may be inserted into the vacuum chamber, the chamber door closed and the process repeated.

The coating thicknesses achieved by this process are in the range of about 800 to 1000 Å. This is a preferred range because thicknesses below about 600 Å are not opaque while thicknesses above about 1000 Å are brittle. Because the metallic coatings are so thin, they replicate the surface which they cover. In addition, they are subject to being worn off by abrasion. Therefore, two additional coatings may be advantageously employed. First, a base coat is applied to the plastic substrate to cover surface defects and level surface roughness. In addition, the base coat provides improved adhesion of the applied chromium coating to the substrate. This is particularly true when coating flexible substrates because of the presence of flow lubricants used in the molding process which tend to rise to the surface of the part under the high vacuums employed in this invention. The application of a base coat thus seals in these flow lubricants to prevent their interfering with the adhesion of the chromium to the plastic substrate. Base coats employed in this process are catalyzed urethanes and polyesters.

Following application of the chromium coating by the process of this invention, the coating is provided with a top coat of like organic material to protect the chromium from wear by abrasion and to some extent corrosion by oxidation. Both the base coat and top coat may be applied by spraying or by other conventional methods. It is important for the top coat to have good clarity and stability so that it remains invisibly clean and does not degrade under ultraviolet radiation. In addition, both the top coat and base coat should have good adhesion to their underlying surfaces and the ability to flex. The following combinations of substrate, base coat and top coat are presently preferred in the practice of this invention. Those designations beginning with the prefix "E" and "X" are products manufactured by Red Spot Paint & Varnish Company. Those beginning with the initial "M" are products manufactured by Bee Chemical Company.

| SUBSTRATE | BASE COAT | TOP COAT |
| --- | --- | --- |
| ABS | EB-1AS & B M472 | ET-4, 6, 24A M475H, UV |
| Noryl | EB-11, A & B M468 | ET24AS & B |
| TPU, TPR | X283, 284 | ET24A & B |

Reference to the following specific example will make the nature of the invention and its advantages more clear.

EXAMPLE

Rigid parts molded of ABS in the form of automobile wheel covers were mounted on the rack. The vacuum equipment employed was a 72-inch vacuum metallizer manufactured by Stokes Division of Pennwalt Corporation, Stokes Model SSC-1. Chromium bars of 99.9% purity 5/16 inch by ¾ inch by 8 inch long were mounted down the center of the rack as heretofore described. The rack was rolled into the vacuum chamber and the door closed. The chamber was then pumped down until a vacuum was reached in the range of 2 to $4 \times 10^{-5}$ mm Hg. When the vacuum was reached, power was supplied through the bus bar to the chromium bars. Initially, about 30% to 50% of the available 55 KVA power supply was applied to heat the chromium bars. Thereafter, the power was increased to 70 to 75% of available power for one minute. Observation of the bars through the sight glass indicated that they were glowing with a bright red color and chromium was being emitted from the surface thereof. At this power setting, between 14 and 16 volts and 2500 to 3000 amps were being supplied to the unit. The coating operation at this setting was continued for about one minute. Throughout the heat-up and coating operation, the rack and parts were being rotated as described above.

Following coating, the power was turned off and the bars allowed to cool. The vacuum was then released allowing the chamber to rise to atmospheric pressure. At that time, the door was opened and the parts removed. Visual examination of the parts and of glass test slides also present in the chamber indicated that a chromium layer of 800 to 1000 Å was present on the part. Visual observation further indicated that the chromium had a uniform bright and reflective appearance closely simulating the traditional appearance of electroplated chrome.

Although this invention has been described particularly in relation to the manufacture of parts for exterior automotive applications, it will be recognized that it is applicable to any industry wherein it is desired to provide plastic substrates with bright, adherent, durable chromium coatings. Examples of such applications include parts used by the furniture, the applicance, and the plumbing industries. Further, although this invention has been described with particular applicability to coating plastic parts, it will be recognized by those skilled in the art that the advantages of the invention may be fully realized on non-plastic substrates.

I claim:

1. A process for applying a bright chromium coating, said coating having substantially the color and appearance of bright electroplated chromium, to the surfaces of articles in a vacuum comprising the steps of securing a high purity chromium body between spaced electrodes in a chamber, said chromium having a purity of about 99.9% or better, mounting the article to be coated in spaced relation to said body, evacuating said chamber to a pressure of at least about $5 \times 10^{-5}$ mm Hg, passing a current directly through said body to evaporate metal from the surface thereof, and condensing the evaporated metal on the surfaces of said article to be coated, said process being carried out for a time sufficient to apply a chromium coating to said article having a thickness in the range of 800 to 1000 Å.

2. The process of claim 1 wherein said chamber is evacuated to a pressure in the range of about 2 to $5 \times 10^{-5}$.

3. The process of claim 1 wherein said process is carried out while said article is rotated about said chromium body.

4. The process of claim 1 wherein said current is first passed through said bar to heat the bar and is thereafter increased to evaporate the metal from the surface thereof.

5. The process of claim 1 wherein said article is first provided with a coating of a material chosen from the group consisting of catalyzed urethanes and polyesters.

6. The process of claim 5 comprising the further step of applying a coating of said material to said chromium coating.

7. An article of manufacture comprising a substrate and an adherent, uniform bright chromium coating, said coating having substantially the color and appearance of bright electroplated chromium, of a thickness in the range of about 800 to 1000 Å, said coating having been applied by vacuum resistance firing of a high purity chromium body by the direct shunting of electrical current therethrough in a vacuum of at least about $5 \times 10^{-5}$ mm Hg.

8. The process of claim 1 wherein the surfaces of said article are plastic.

9. The article of claim 7 wherein said substrate is plastic.

* * * * *